United States Patent
Ghalei et al.

(10) Patent No.: US 12,431,546 B2
(45) Date of Patent: Sep. 30, 2025

(54) DETECTING ELECTROLYTE ON CIRCUIT BOARDS

(71) Applicant: Apple Inc., Cupertino, CA (US)

(72) Inventors: Pouya Ghalei, San Jose, CA (US); Cong Zheng, San Jose, CA (US); Shunlong Xiao, San Jose, CA (US); Manpreet Singh, Union City, CA (US); Charles E Chang, Coto De Caza, CA (US); Steve Chikin Lo, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 739 days.

(21) Appl. No.: 17/856,525

(22) Filed: Jul. 1, 2022

(65) Prior Publication Data
US 2024/0006669 A1    Jan. 4, 2024

(51) Int. Cl.
*H01M 10/42* (2006.01)
*H01M 10/48* (2006.01)
*H05K 1/09* (2006.01)
*H05K 1/18* (2006.01)

(52) U.S. Cl.
CPC ....... *H01M 10/425* (2013.01); *H01M 10/484* (2013.01); *H05K 1/09* (2013.01); *H05K 1/181* (2013.01); *H01M 2010/4271* (2013.01); *H05K 2201/09218* (2013.01)

(58) Field of Classification Search
CPC .......... H01M 50/569–597; H01M 2010/4271; G01R 31/50–74
See application file for complete search history.

(56) References Cited

U.S. PATENT DOCUMENTS

| | | | |
|---|---|---|---|
| 6,337,559 B1 | 1/2002 | Sato | |
| 7,190,148 B2 | 3/2007 | Ooshita et al. | |
| 8,116,044 B2 | 2/2012 | Pelc et al. | |
| 8,877,370 B2 | 11/2014 | Kim | |
| 10,725,117 B2 | 7/2020 | Olson et al. | |
| 2016/0178475 A1* | 6/2016 | Krishnan | H05K 7/20836 324/713 |
| 2017/0227415 A1* | 8/2017 | Jang | G01N 17/02 |
| 2019/0369153 A1* | 12/2019 | Olson | G01M 3/40 |

* cited by examiner

*Primary Examiner* — Haroon S. Sheikh
(74) *Attorney, Agent, or Firm* — Fletcher Yoder, PC

(57) ABSTRACT

A battery circuit board includes a substrate, a first trace configured to receive a voltage and forming a first closed loop around a perimeter of the substrate, and a second trace forming a second closed loop around the perimeter of the substrate. The battery circuit board also includes an electrical assembly configured to determine a presence of an electrolyte on the battery circuit board in response to a short circuit between the first closed loop of the first trace and the second closed loop of the second trace.

20 Claims, 4 Drawing Sheets

DETECTING ELECTROLYTE ON CIRCUIT BOARDS

BACKGROUND

The present disclosure relates generally to detecting electrolyte. More specifically, the present disclosure relates to detecting electrolyte leakage on circuit boards of a battery.

A battery, such as a secondary (e.g., rechargeable) battery, may include a pouch and various components disposed in the pouch (or can), such as electrodes, one or more separators, and electrolyte. Terminals of the battery may be coupled with the electrodes, such as tabs of the electrodes, and protrude outside of the pouch. The terminals may be configured to couple the battery to a load, such as an electronic device, to power the load. A battery management unit (BMU) may be disposed outside of the pouch and configured to monitor various operating characteristics of the battery, control various aspect of the battery, or both. Other componentry may be employed to mount the BMU to the pouch and seal the electrolyte within the pouch.

In certain conditions, the electrolyte may leak from the pouch of the battery. Electrolyte leaked from the pouch of the battery may present a short circuit risk to various aspects of the battery and/or the load, such as the electronic device powered by the battery. Further, a capacity and/or state-of-charge (SOC) of the battery may be reduced as the electrolyte is leaked from the pouch. Certain traditional batteries may not include features configured to detect electrolyte leaks. While certain other traditional batteries may include features configured to detect electrolyte leaks, said features may be unreliable and expensive. Additionally or alternatively, said features may be relatively large or consume an excessive volume of the battery, thereby substantially reducing a volumetric energy density of the battery. Accordingly, it is now recognized that improved batteries and electrolyte leak detection are desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, a battery circuit board includes a substrate, a first trace configured to receive a voltage and forming a first closed loop adjacent to a perimeter of the substrate, and a second trace forming a second closed loop adjacent to the perimeter of the substrate. The battery circuit board also includes an electrical assembly configured to determine a presence of a material on the battery circuit board in response to a short circuit between the first closed loop of the first trace and the second closed loop of the second trace.

In another embodiment, a battery includes a substrate, a first closed loop trace extending adjacent to a perimeter of the substrate, and a second closed loop trace extending adjacent to the perimeter of the substrate and positioned inward from the first closed loop trace. The battery also includes an electrical assembly coupled to the second closed loop trace and configured to determine a presence or an absence of a material on the substrate in response to a change in a voltage difference between the first closed loop trace and the second closed loop trace.

In yet another embodiment, a battery includes a substrate, a first closed loop trace disposed on the substrate, a second closed loop trace disposed on the substrate inwards from the first closed loop trace, an extension from the second closed loop trace, and a resistor coupled to the extension. The battery also includes a third trace coupled to the resistor, an additional resistor coupled to a node at the third trace and to ground, and a comparison device coupled to the third trace such that the third trace is between the comparison device and the resistor. The comparison device is configured to receive a voltage caused by a short circuit between the first closed loop trace and the second closed loop trace, and determine or indicate a presence or an absence of a material on the substrate based on the voltage.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
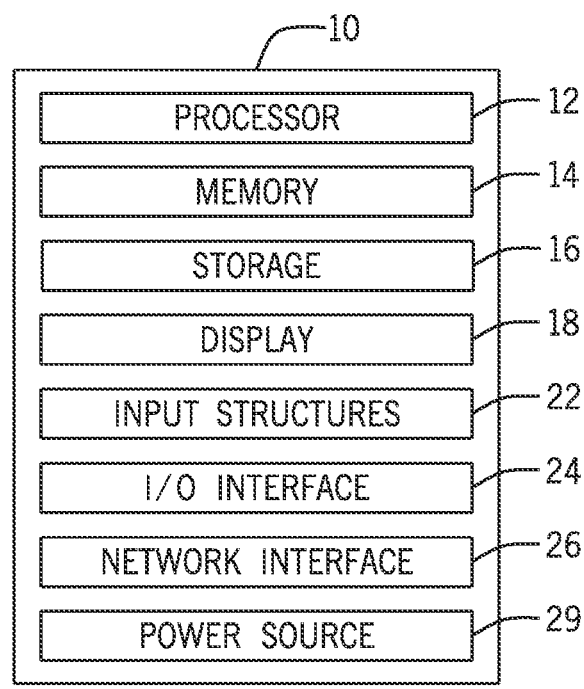
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on).

The present disclosure relates generally to detecting a material (e.g., electrolyte) on a circuit board. More specifically, the present disclosure relates to detecting electrolyte leaked from a pouch (or can) of a battery onto a circuit board of the battery.

In accordance with the present disclosure, a battery (e.g., a secondary or rechargeable battery, such as a lithium-ion battery) may include electrodes (e.g., anodes and cathodes), one or more separators, and electrolyte disposed in a pouch (or housing). The battery may also include terminals extending outside of the pouch and configured to couple to a load, such as an electronic device (e.g., a smartphone), to enable the battery to power the load. Further, the battery may include a battery management unit (BMU) disposed outside of the pouch. The BMU may be configured to monitor various operating characteristics of the battery, such as state-of-charge (SOC), temperature, pressure, and the like. The BMU may also control various aspects of the battery, such as charging and discharging of the battery. Various other componentry of the battery, such as adhesives and/or sealants, may be employed to mount the BMU to the pouch and/or seal the pouch, for example, to block the electrolyte from escaping the pouch. In some embodiments, a housing (e.g., outer housing) of the battery may receive certain or all of the above-described componentry of the battery and facilitate access to the battery terminals for coupling to the load.

In certain conditions, the electrolyte may leak from the pouch of the battery. For example, features configured to seal the electrolyte within the pouch may degrade and/or fail in response to unexpected disturbances. Electrolyte leaked from the pouch of the battery may present a short circuit risk to the battery, the load powered by the battery, or both. For example, leaked electrolyte present on a circuit board of the BMU, or some other circuit board or substrate associated with the battery, may cause an undesirable short circuit between circuitry of the circuit board or substrate.

In accordance with the present disclosure, a circuit board of the battery (e.g., the circuit board of the BMU) includes various features configured to detect a presence of a material or substance (e.g., an electrolyte) on the circuit board. For example, the circuit board may include a substrate, a first trace forming a first closed loop adjacent to a perimeter of the substrate, and a second trace forming a second closed loop adjacent to the perimeter of the substrate. The second closed loop may be disposed inwards from the first closed loop and separated from the first closed loop by a relatively small gap (e.g., may be encircled by the first closed loop). For example, the gap between the first closed loop and the second closed loop may be smaller than any other gaps between any other conductive traces or loops of the circuit board.

The first closed loop formed by the first trace may be configured to receive a voltage from a source of power, such as the battery, the BMU of the battery, or some other source of power. The voltage may be, for example, 5 volts of direct current (VDC). In normal operating conditions in which the electrolyte is not present on the circuit board, the second closed loop formed by the second trace may not receive a voltage. However, electrolyte leaked on the circuit board may cause electrochemical migration that gradually or eventually creates a short circuit between the first closed loop formed by the first trace and the second closed loop formed by the second trace. The short circuit may generate a voltage in the second closed loop formed by the second closed trace. In this way, a voltage difference between the first closed loop and the second closed loop may be reduced in response to the short circuit caused by electrolyte leakage.

As described above, the gap between the first closed loop and the second closed loop may be smaller than any other gaps between any other conductive traces or loops of the circuit board. By including the relatively small gap between the first closed loop and the second closed loop, the short circuit caused by the presence of the electrolyte on the circuit board may occur between the first closed loop and the second closed loop before other short circuits might occur between other conductive traces or loops of the circuit board. As described below, the short circuit between the first closed loop and the second closed loop (or electrical characteristics associated with the short circuit) may be controlled in a manner that blocks the short circuit from negatively affecting the battery.

The circuit board may include an electrical assembly, referred to in certain instances of the present disclosure as a sensor assembly), coupled to the second closed loop formed by the second trace. In general, the electrical assembly is employed to determine the presence of the electrolyte on the circuit board and block the above-described short circuit from negatively affecting the battery. The electrical assembly may include a first resistor having a first end coupled to an extension from the second closed loop formed by the second trace, and having a second end coupled to a third trace of the electrical assembly. The electrical assembly may also include a comparison device or component (e.g., a comparator, analog-to-digital converter (ADC), and the like) coupled to the third trace such that the third trace is disposed between (e.g., in series with) the first resistor and the comparison device. Further, the electrical assembly may include a second resistor having a first end coupled to a node at the third trace and a second end coupled to ground.

In general, the first resistor and the second resistor are configured to block the short circuit generated between the first closed loop and the second closed loop from negatively affecting the battery. For example, the first resistor may limit a current in the electrical assembly. The second resistor may also limit the current in the electrical assembly and/or pull the voltage in the electrical assembly to ground during normal operating conditions (e.g., before a sufficient amount of the electrolyte is present on the circuit board). Indeed, while the short circuit between the first closed loop and the second closed loop enables the comparison device of the electrical assembly to determine the presence of the electrolyte on the circuit board as described below, the first and second resistors generally prevent the short circuit from negatively affecting the battery.

The comparison device may be configured to receive, from the third trace, a voltage (or change in voltage) generated by the above-described short circuit, and compare the voltage with a threshold voltage. The comparison device may determine the presence of the electrolyte on the circuit board in response to the voltage exceeding the threshold voltage. In some embodiments, the BMU of the battery may receive, from the comparison device, an indication or signal indicative of the presence of the electrolyte on the circuit board. Further, the BMU may perform various actions in response to the indication or signal indicative of the presence of the electrolyte on the circuit board. For example, in response to the indication or signal received from the comparison device, the BMU may disable charging of the battery, execute a discharge profile to discharge the battery, and/or transmit an alert indicative of an electrolyte leak to an external device.

In some embodiments, the signal received by the BMU and from the comparison device may be indicative of an amount or extent (e.g., magnitude) of the electrolyte leaked on the circuit board, and the type of action performed by the BMU in response to the signal may be dependent on the amount or the extent of the electrolyte leaked on the circuit board. For example, the actions performed by the BMU in response to the signal may escalate as the amount or the extent of the electrolyte leaked on the circuit board increases. Additionally or alternatively, control actions performed by the BMU may be dependent on (e.g., escalate in response to) a rate at which the electrolyte present on the circuit board increases.

In general, presently disclosed embodiments provide small, cost effective, and reliable mechanisms for detecting the presence of the electrolyte on circuit boards. These and other features are described in detail below with reference to the drawings. It should be noted that, while the description above and below includes reference to electrolyte detection in the context of a circuit board for a battery, the electrolyte detection features may be employed in other contexts, such as in the context of a circuit board that does not correspond to the battery (e.g., a circuit board employed in a load powered by the battery, or some other circuit board).

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth). The power source 29 of the electronic device 10 may include any suitable source of power, such as a rechargeable lithium polymer (Li-poly) battery and/or an alternating current (AC) power converter.

In accordance with the present disclosure, and as described in detail below with reference to later drawings, a battery (e.g., corresponding to the power source 29) of the electronic device 10 may include a pouch and various features disposed in the pouch, such as electrolyte. The battery also includes various features configured to detect a material or substance (e.g., electrolyte) leaked from the pouch and onto, for example, a substrate and/or a circuit board, such as a circuit board of a battery management unit (BMU) of the battery. These and other features are described in detail below.

Figure 2:
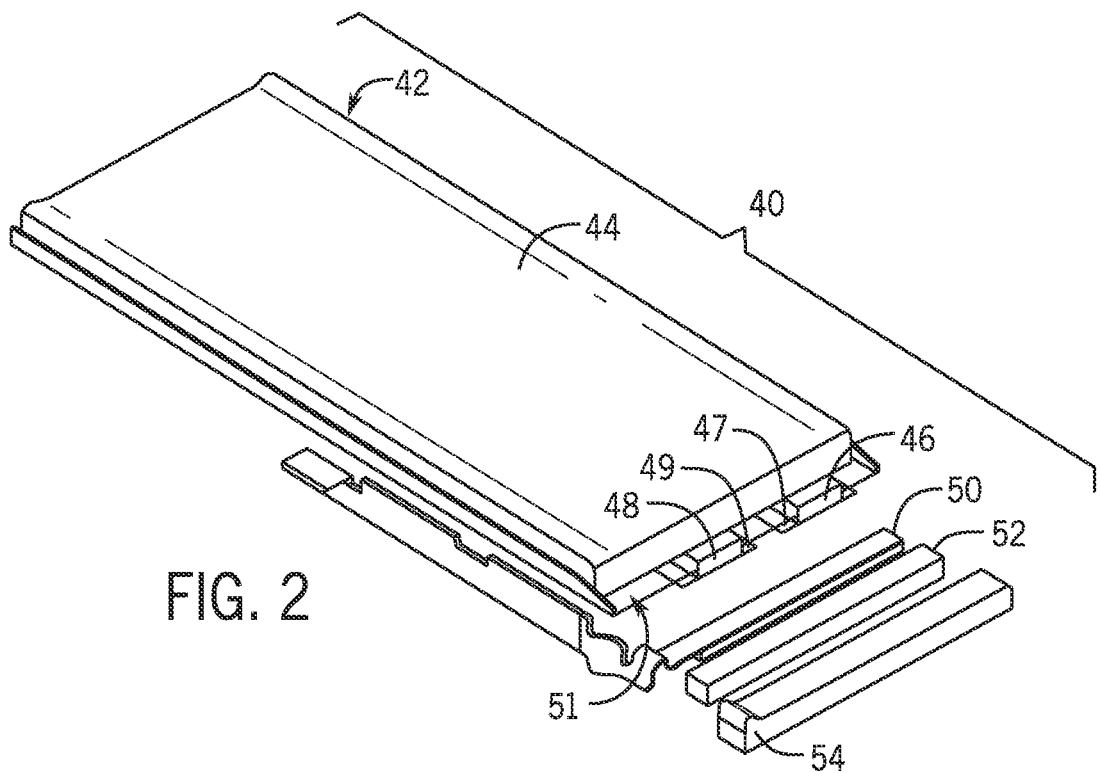
FIG. 2 is an exploded perspective view of a battery of the electronic device of FIG. 1, according to embodiments of the present disclosure.

FIG. 2 is an exploded perspective view of an embodiment of a battery 40 of the electronic device 10 of FIG. 1. The battery 40 may correspond to, for example, the power source 29 of the electronic device 10 in FIG. 1. In the illustrated embodiment, the battery 40 includes a battery cell 42 having a pouch 44 (or can) configured to receive electrodes (e.g., at least one anode and at least one cathode), a separator, and a material or substance (e.g., electrolyte). The battery cell 42 may also include a first terminal 46 protruding from the pouch 44, first sealant 47 configured to seal the pouch 44 about the first terminal 46, a second terminal 48 protruding from the pouch 44, and second sealant 49 configured to seal the pouch 44 about the second terminal 48. The battery 40 in FIG. 2 may also include a battery management unit (BMU) 50 configured to be disposed on a terrace 51 formed by the pouch 44. Further, the battery 40 may include ingress tape 52 configured to block ingress of contaminants toward the BMU 50 and/or the battery cell 42, and cosmetic tape 54 that fits over the BMU 50 and the terrace 51 (and my act as an insulator).

Figure 3:
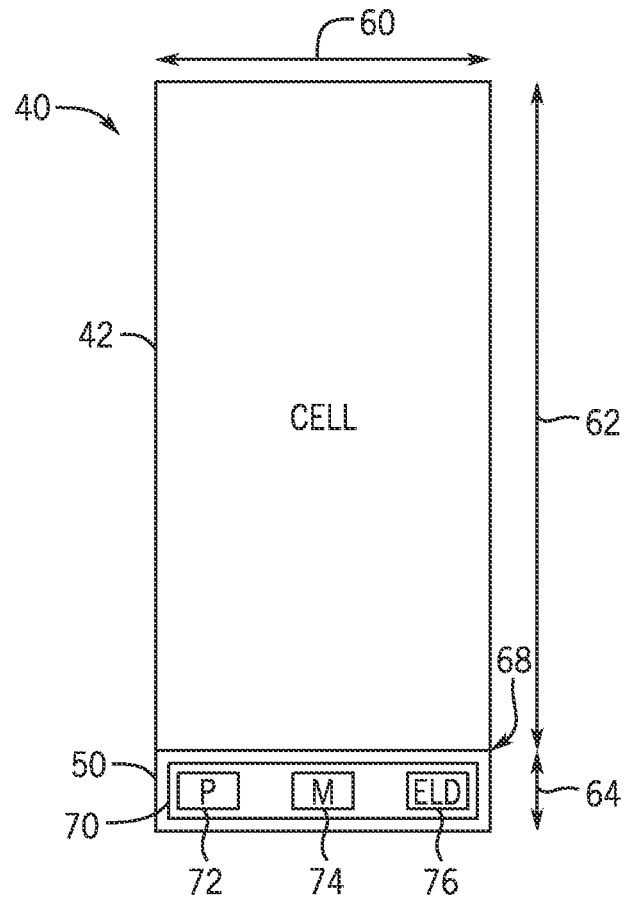
FIG. 3 is a schematic cross-sectional view of the battery of FIG. 2, according to embodiments of the present disclosure.

In general, the BMU 50 may be configured to monitor operating conditions of the battery 40 and/or perform various control actions associated with the battery 40, such as detecting a presence of an electrolyte on a circuit board of the BMU 50 and controlling one or more aspects of the battery 40 in response to detecting the presence of the electrolyte at the BMU 50. For example, FIG. 3 is a cross-sectional view of an embodiment of the battery 40 of FIG. 2. In the illustrated embodiment, the battery 40 includes the battery cell 42 and the BMU 50 coupled to the battery cell 42. Although other dimensions are also possible, the battery cell 42 may include a width 60 of approximately 40-50 millimeters, the battery cell 42 may include a height 62 of approximately 80-90 millimeters, and the BMU 50 may include a height 64 of approximately 1-5 millimeters. The BMU 50 in the illustrated embodiment includes a circuit board 70, processing circuitry 72 on the circuit board 70, memory circuitry 74 on the circuit board 70, and electrolyte leak detection circuitry 76 on the circuit board 70. In some embodiments, the processing circuitry 72 and/or the memory circuitry 74 may be disposed on one or more circuit boards separate from the circuit board 70 having the electrolyte leak detection circuitry 76. While the electrolyte leak detection features are described in detail below with reference to the circuit board 70 of the BMU 50, the electrolyte leak detection features may be employed in a different circuit board, such as a circuit board of the battery 40 separate from the BMU 50, a circuit board of the load being powered by the battery 40, etc.

The electrolyte leak detection circuitry 76 may be configured to detect the presence of the electrolyte on the circuit board 70. For example, in response to unexpected disturbances to the battery 40 and/or degradation of sealant features of the battery 40, electrolyte may leak from the battery cell 42 (e.g., the pouch 44 of the battery cell 42 in FIG. 2) and onto the circuit board 70 of the BMU 50. The electrolyte leak detection circuitry 76 may detect the presence of the electrolyte on the circuit board 70 and transmit a signal indicative of the presence of the electrolyte on the circuit board 70 to the processing circuitry 72.

The processing circuitry 72 may be configured to execute instructions stored on the memory circuitry 74 to perform various functions. For example, the processing circuitry 72 may control one or more aspects of the battery 40 in response to the signal indicative of the presence of the electrolyte on the circuit board 70. Indeed, the processing circuitry 72 of the BMU 50 may disable charging of the battery 40, execute a discharge profile to discharge the battery 40, transmit an alert indicative of the presence of the electrolyte on the circuit board 70 to an external device, and/or perform other control actions.

In some embodiments, the signal indicative of the presence of the electrolyte on the circuit board 70 may be indicative of an amount of the electrolyte present on the circuit board 70 (e.g., leaked electrolyte amount), a rate at which the electrolyte present on the circuit board 70 is increasing (e.g., electrolyte leak rate), or the like. The processing circuitry 72 may be configured to perform various actions based at least in part on the leaked electrolyte amount and/or the electrolyte leak rate. For example, the processing circuitry 72 may transmit the alert indicative of the presence of the electrolyte on the circuit board 70 in response to a first leaked electrolyte amount and/or a first electrolyte leak rate, disable charging of the battery 40 in response to a second leaked electrolyte amount and/or a second electrolyte leak rate, execute the discharge profile to discharge the battery 40 in response to a third leaked electrolyte amount and/or a third electrolyte leak rate, and perform some other control action in response to a fourth electrolyte leak amount and/or a fourth electrolyte leak rate. Other control actions and control schemes are contemplated by the present disclosure and describe in detail with reference to later drawings.

Figure 4:
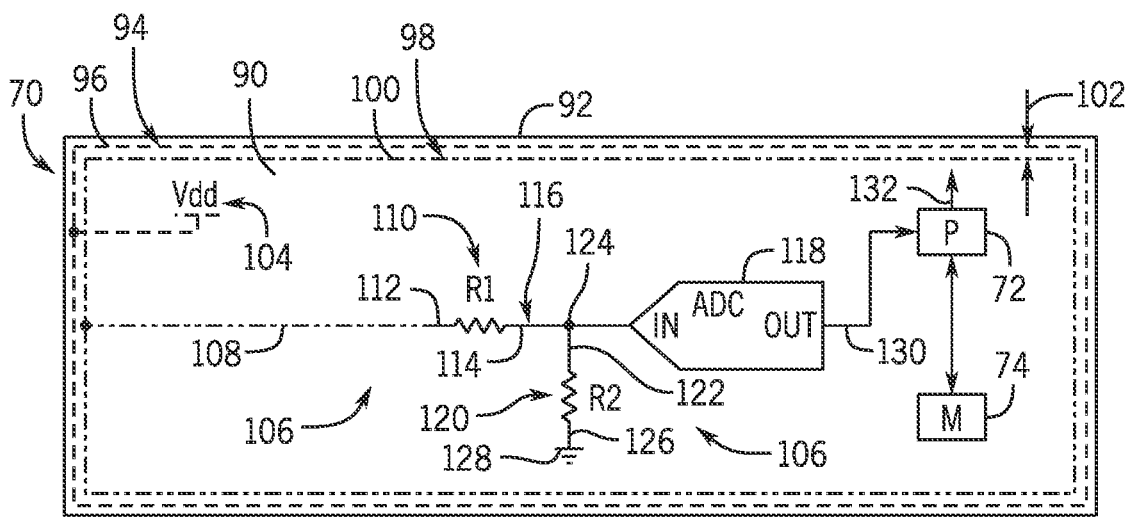
FIG. 4 is an overhead schematic view of a circuit board of a battery management unit (BMU) of the battery of FIGS. 2 and 3, according to embodiments of the present disclosure.

FIG. 4 is an overhead schematic view of an embodiment of the circuit board 70 of a BMU 50 of the battery 40 of FIGS. 2 and 3. In the illustrated embodiment, the circuit board 70 includes a substrate 90 defining a perimeter 92 of the circuit board 70, a first trace 94 forming a first closed loop 96 (collectively referred to as a first closed loop trace in certain instances of the present disclosure), and a second trace 98 forming a second closed loop 100 (collectively referred to as a second closed loop trace in certain instances of the present disclosure). As shown, the first trace 94 includes the first closed loop 96 extending adjacent to and/or along with the perimeter 92 of the substrate 90, and the second trace 98 includes the second closed loop 100 extending adjacent to and/or along with the perimeter 92 of the substrate 90.

The second closed loop 100 formed by the second trace 98 may be disposed inwards from (e.g., encircled or surrounded by) the first closed loop 96 formed by the first trace 94. In this way, the first closed loop 96 formed by the first trace 94 may be disposed between the perimeter 92 of the substrate 90 and the second closed loop 100 formed by the second trace 98. The first closed loop 96 and the second closed loop 100 may be separated by a gap 102 having a size of approximately 0.01 millimeters to 0.5 millimeters, although the size of the gap 102 may vary based on the battery size and/or circuit board size. The size of the gap 102 between the first closed loop 96 and the second closed loop 100 may be smaller than sizes of any other gaps between any other conductive traces on the substrate 90 of the circuit board 70. The first closed loop 96 formed by the first trace 94 may be spaced from the perimeter 92 by, for example, between approximately 0.01 millimeters to 0.5 millimeters, although the spacing from the perimeter 92 may vary based on the battery size and/or circuit board size.

The first closed loop 96 formed by the first trace 94 may receive a supply voltage 104, referred to in certain instances of the present disclosure as "Vdd," during normal operation of the battery employing the circuit board 70. The supply voltage 104 may be, for example, 5 VDC. In some embodiments, the first closed loop 96 may receive the supply voltage 104 from the processing circuitry 72, which may be disposed on the circuit board 70 (as shown) or on a separate circuit board, BMU feature, or battery feature. Other power sources for providing the supply voltage 104 are also contemplated. During normal operating conditions, the second closed loop 100 formed by the second trace 98 may not receive a voltage. In some cases, the second closed loop 100 may receive the supply voltage 104, and the first closed loop 96 may not receive a voltage. In any case, during normal operation, a voltage difference between the first closed loop 96 and the second closed loop 100 may be substantially equal to the supply voltage 104. In additional or alternative embodiments, both loops 96, 100 may receive different supply voltages 104, such that there is the voltage difference between the voltages in the loops 96, 100.

When electrolyte leaks onto the substrate 90 of the circuit board 70, the electrolyte may cause electrochemical migration that gradually creates and/or increases a short circuit between the first closed loop 96 and the second closed loop 100. The short circuit may generate a voltage in the second closed loop 100. In this way, the voltage difference between the first closed loop 96 and the second closed loop 100 may be reduced in response to the short circuit. As described in detail below, an electrical assembly 106 coupled to the second closed loop 100 formed by the second trace 98 may be employed to detect the presence of the electrolyte on the substrate 90 of the circuit board 70 in response to the above-described short circuit. In general, the first closed loop 96 formed by the first trace 94, the second closed loop 100 formed by the second trace 98, and the electrical assembly 106 described in detail below may correspond to the electrolyte leak detection circuitry 76 illustrated in FIG. 3.

With reference again to the embodiment illustrated in FIG. 4, the electrical assembly 106 may extend inwards from the second closed loop 100 formed by the second trace 98. The electrical assembly 106 may include an extension 108 from the second closed loop 100 formed by the second trace 98, a first resistor 110 having a first end 112 coupled to the extension 108 and a second end 114 opposing the first end 112, a third trace 116 coupled to the second end 114 of the first resistor 110, and a comparison device or component 118 (e.g., a comparator, an analog-to-digital converter (ADC), or the like) coupled to the third trace 116. As shown, the third trace 116 may be disposed between the first resistor 110 and the comparison device 118 such that the third trace 116 is in series with the first resistor 110 and the comparison device 118. It should be noted that the comparison device 118 may be a part of the processing circuitry 72 or separate from the processing circuitry 72.

As previously described, when electrolyte is present on the substrate 90 of the circuit board 70, electrochemical migration may create a short circuit between the first closed loop 96 that receives the supply voltage 104 and the second closed loop 100. The short circuit may generate a voltage in the second closed loop 100 that causes an electric current to travel through the electrical assembly 106. In general, the comparison device 118 is configured to receive a voltage (or a change in voltage) corresponding to the short circuit between the first closed loop 96 and the second closed loop 100, and determine the presence of the electrolyte on the substrate 90 of the circuit board 70 in response to the voltage exceeding a threshold voltage (or the change in voltage causing a voltage difference between the first closed loop 96 and the second closed loop 100 to exceed a threshold voltage). In some embodiments, the comparison device 118 is configured to determine or indicate the absence of the short circuit and/or electrolyte on the substrate 90 of the circuit board 70 in response to the voltage being below the threshold voltage (or the change in voltage causing the voltage difference between the first closed loop 96 and the second closed loop 100 to be below the threshold voltage). The first resistor 110 is generally configured to limit or regulate an electric current through the electrical assembly 106, which protects the circuit board 70 from being negatively affected by the above-described short circuit, while still enabling the comparison device 118 to determine (or indicate) the presence of the electrolyte on the circuit board 70 in response to the above-described short circuit.

In addition to the above-described features, the electrical assembly 106 may include a second resistor 120 having a first end 122 coupled to a node 124 at the third trace 116. A second end 126 of the second resistor 120 may be coupled to ground 128. Like the first resistor 110 described above, the second resistor 120 may be configured to limit or regulate the flow of electric current through the electrical assembly 106. Additionally or alternatively, the second resistor 120 may pull the voltage through the electrical assembly 106 to the ground 128 during normal operation of the battery corresponding to the circuit board 70 and/or before the short circuit between the first closed loop 96 and the second closed loop 100 is sufficiently large.

When an amount of the electrolyte present on the substrate 90 of the circuit board 70 is sufficiently large, the comparison device 118 may receive a voltage corresponding to the short circuit between the first closed loop 96 and the second closed loop 100, as previously described. The comparison device 118 may compare the voltage with at least one threshold voltage. In response to the voltage exceeding the at least one threshold voltage, the comparison device 118 may output an indication or a signal 130 indicative of the presence of the electrolyte on the substrate 90 of the circuit board 70 to the processing circuitry 72. As previously described, the processing circuitry 72 may be disposed on the substrate 90 of the circuit board 70 or elsewhere (e.g., on a separate circuit board). The processing circuitry 72 may receive the signal 130 and perform various actions (e.g., via one or more control signals 132) based on the signal 130 received from the comparison device 118.

The one or more control signals 132 in FIG. 4 may be employed, with reference to FIG. 3, for example, to disable charging of the battery 40, execute a discharge profile to discharge the battery 40, transmit an alert indicative of the presence of the electrolyte on the circuit board 70 to an external device, and/or initiate some other control action in accordance with the present disclosure. In some embodiments, the control actions may be performed based on a specific characteristic of the signal 130 in FIG. 4. For example, the signal 130 transmitted from the comparison device 118 to the processing circuitry 72 may include a specific characteristic (e.g., a voltage value) indicative of an amount of the electrolyte on the substrate 90 of the circuit board 70, a rate at which the amount of the electrolyte on the substrate 90 of the circuit board 70 is increasing, or both. Indeed, the amount of the electrolyte present on the substrate 90 of the circuit board 70 may be determined or indicated based on a value of the voltage received by the comparison device 118. Further, the rate at which the amount of the electrolyte present on the substrate 90 of the circuit board 70 is increasing may be determined or indicated based at least in part on the rate at which the voltage received by the comparison device 118 changes. The processing circuitry 72 may perform specific control actions based on the amount of the electrolyte present on the substrate 90 of the circuit board 70 and/or the rate at which the amount of the electrolyte present on the substrate 90 of the circuit board 70 increases. These and other features will be described in detail below with reference to later drawings.

Figure 5:
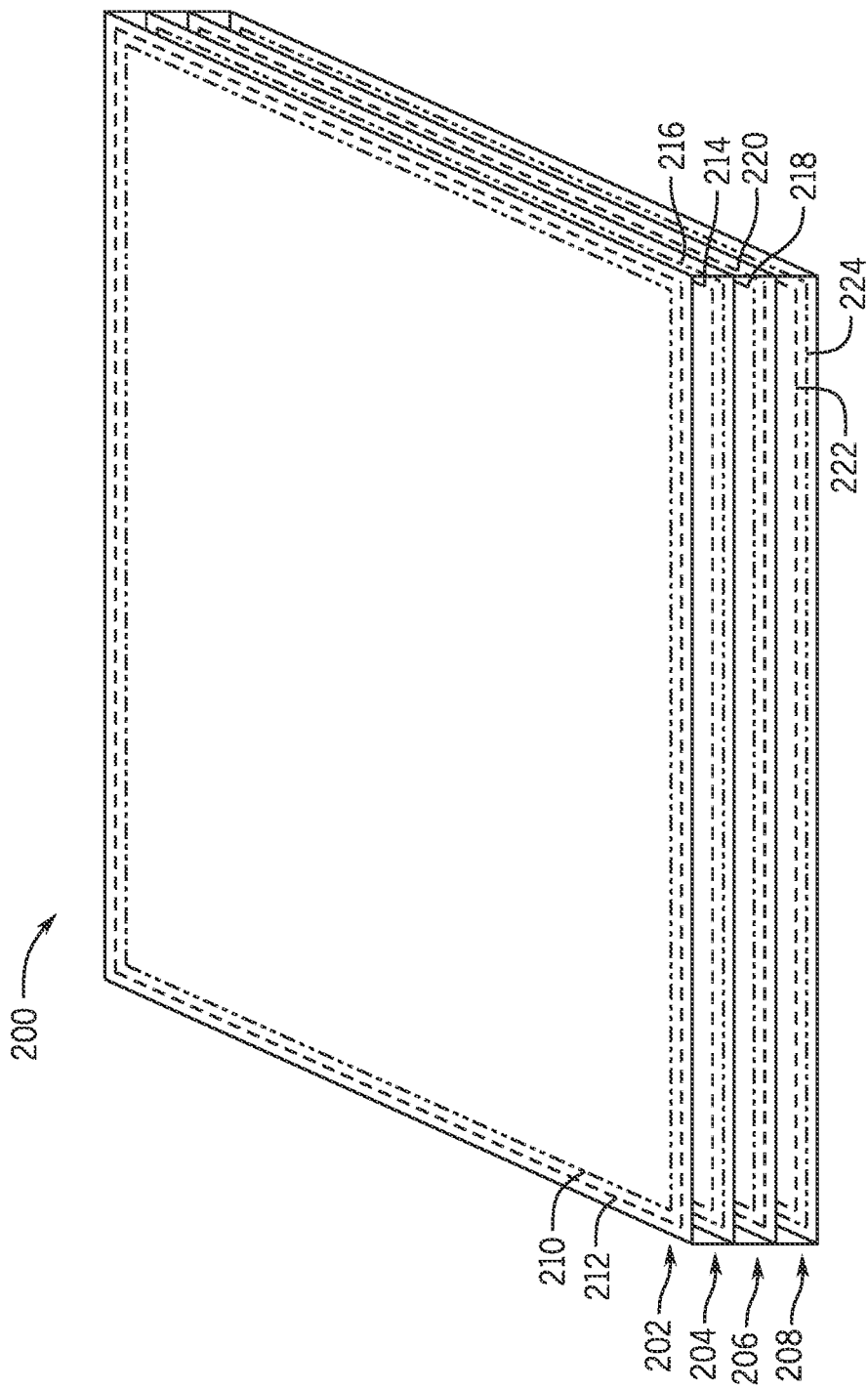
FIG. 5 is a perspective view of a circuit board assembly having electrolyte leak detection features for multiple circuit boards employed, for example, in a BMU of the battery of FIGS. 2 and 3, according to embodiments of the present disclosure.

FIG. 5 is a perspective view of an embodiment of a circuit board assembly 200 having electrolyte leak detection features for multiple circuit board layers employed, for example, in the BMU 50 of the battery 40 of FIGS. 2 and 3. In the illustrated embodiment, the circuit board assembly 200 includes a first circuit board layer 202, a second circuit board layer 204, a third circuit board layer 206, and a fourth circuit board layer 208. However, the circuit board assembly 200 may include more than four circuit board layers, such as N layers (e.g., where N is greater than 4). The first circuit board layer 202 includes a first inner closed loop trace 210 and a first outer closed loop trace 212, the second circuit board layer 204 includes a second inner closed loop trace 214 and a second outer closed loop trace 216, the third circuit board layer 206 includes a third inner closed loop trace 218 and a third outer closed loop trace 220, and the fourth circuit board layer 208 includes a fourth inner closed loop trace 222 and a fourth outer closed loop trace 224.

The first outer closed loop trace 212 of the first circuit board layer 202, the second inner closed loop trace 214 of the second circuit board layer 204, the third outer closed loop trace 220 of the third circuit board layer 206, and the fourth inner closed loop trace 222 of the fourth circuit board layer 208 may be configured to receive a supply voltage (e.g., "Vdd"), for example, from one or more processors. During normal operating conditions, the first inner closed loop trace 210 of the first circuit board layer 202, the second outer closed loop trace 216 of the second circuit board layer 204, the third inner closed loop trace 218 of the third circuit board layer 206, and the fourth outer closed loop trace 224 of the fourth circuit board layer 208 may not be configured to receive a voltage and may be referred to as sensor traces. In additional or alternative embodiments, the traces receiving the supply voltage and the traces not receiving the supply voltage may be reversed. In some embodiments, each circuit board layer 202, 204, 206, 208 may include the electrical assembly 106 illustrated in FIG. 4 and described in detail above. Additionally or alternatively, in some embodiments, only one of the circuit board layers 202, 204, 206, 208 (or more) may include the electrical assembly 106 illustrated in FIG. 4 and described in detail above.

In general, the inner and outer closed loop traces described above may alternate from circuit board layer to circuit board layer. That is, the closed loop trace that receives a supply voltage alternates or toggles between the inner layer and the outer layer in adjacent circuit board layers, and the closed loop trace that does not receive the supply voltage alternates or toggles between the outer layer and the inner layer in adjacent circuit board layers. For example, the first outer closed loop trace 212 of the first circuit board layer 202 is configured to receive a supply voltage, whereas the second inner closed loop trace 214 of the second circuit board layer 204 is configured to receive a supply voltage.

In this way, a short circuit may be created between, for example, the first outer closed loop trace 212 (which receives a supply voltage) of the first circuit board layer 202 and the second outer closed loop trace 216 (which does not receive a supply voltage) of the second circuit board layer 204 in response to the presence of electrolyte in the first or second circuit board layers 202, 204. Thus, the circuit board assembly 200 in FIG. 5 enables the detection of electrolyte leaks at multiple locations, such as at the first circuit board layer 204 (e.g., between the first inner closed loop trace 210 and the first outer closed loop trace 212), the second circuit board layer 204 (e.g., between the second inner closed loop trace 214 and the second outer closed loop trace 216), the third circuit board layer 206 (e.g., between the third inner closed loop trace 218 and the third outer closed loop trace 220), the fourth circuit board layer 208 (e.g., between the fourth inner closed loop trace 222 and the fourth outer closed loop trace 224), or any combination thereof. Further, the circuit board assembly 200 in FIG. 5 enables one of the circuit board layers 202, 204, 206, 208 (and corresponding processing componentry) to identify and/or respond to the presence of electrolyte on another of the circuit board layers 202, 204, 206, 208 (e.g., between the first outer closed loop trace 212 and the second outer closed loop trace 216, between the second outer closed loop trace 216 and the third outer closed loop trace 220, or between the third outer closed loop trace 220 and the fourth outer closed loop trace 224).

Figure 6:
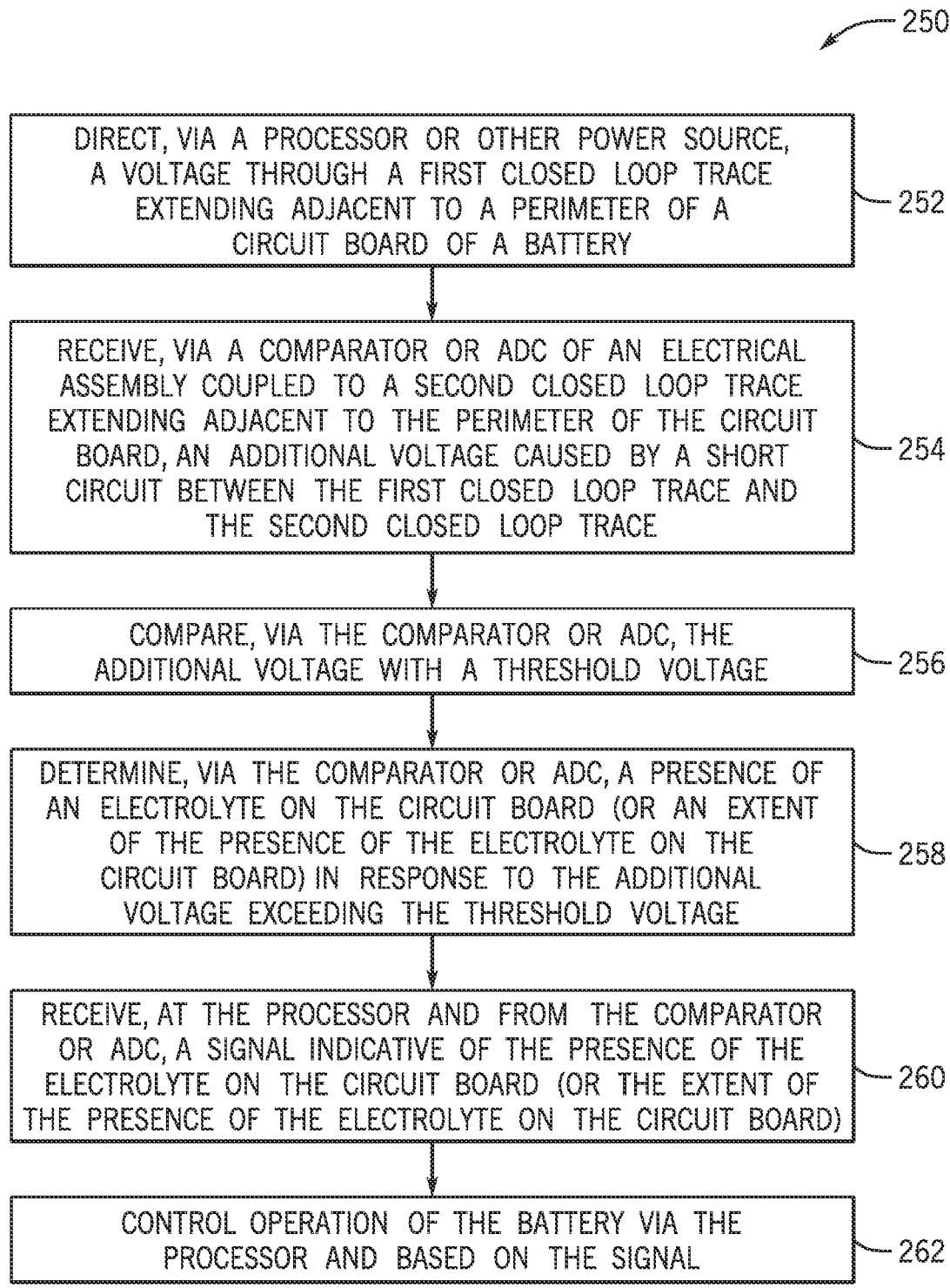
FIG. 6 is a process flow diagram illustrating a method for detecting a presence of an electrolyte on a circuit board and controlling a battery based on the presence of the electrolyte on the circuit board, according to embodiments of the present disclosure.

FIG. 6 is a process flow diagram illustrating an embodiment of a method 250 for detecting a presence of a material or substance (e.g., electrolyte). For example, with reference to structural features described in detail above with respect to FIGS. 1-5, the method 250 may be employed for detecting the presence of the electrolyte on the circuit board 70 and controlling the battery 40 based on the presence of the electrolyte on the circuit board 70. It should be understood that the following process blocks may be performed in the order described below, or in alternative orders. In the illustrated embodiment, the method 250 includes directing (block 252), via the processor 72 or other power source, the voltage 104 (e.g., a supply voltage, referred to in certain instances of the present disclosure as Vdd) through the first closed loop trace 96 extending adjacent to the perimeter 92 of the circuit board 70 of the battery 40. The voltage directed through the first closed loop trace 96 may be, for example 5 VDC.

The method 250 also includes receiving (block 254), via the comparison device 118 of the electrical assembly 106 coupled to the second closed loop trace 100 extending adjacent to the perimeter 92 of the circuit board 70, an additional voltage caused by a short circuit between the first closed loop trace 96 and the second closed loop trace 100. For example, the first closed loop trace 96 and the second closed loop trace 100 may be separated by a gap 102. During normal operating conditions, in other words when the electrolyte is not present on the circuit board 70, the second closed loop trace 100 may not receive a voltage. When electrolyte is present on the circuit board 70, electrochemical migration caused by the presence of the electrolyte may create a short circuit between the first closed loop trace 96 and the second closed loop trace 100. The electrical assembly 106 may include various features coupling the second closed loop trace 100 with the comparison device 118. For example, one or more resistors 110, 120 may be employed between the second closed loop trace 100 and the comparison device 118, the one or more resistors 110, 120 being configured to limit or regulate an electric current through the electrical assembly 106. In this way, the electrical assembly 106 enables the comparison device 118 to receive the additional voltage in response to the short circuit while also blocking the circuit board 70 (and/or corresponding battery 40) from being negatively affected by the short circuit.

The method 250 also includes comparing (block 256), via the comparison device 118, the additional voltage with a threshold voltage. Further, the method 250 includes determining (block 258), via the comparison device 118, a presence of an electrolyte on the circuit board 70 (or an extent of the presence of the electrolyte on the circuit board 70) in response to the additional voltage exceeding the threshold voltage. In some embodiments, multiple threshold voltages may be employed. For example, the additional voltage may be indicative of an amount of electrolyte present on the circuit board 70 (e.g., an electrolyte leak amount), a rate at which the amount of electrolyte present on the circuit board 70 is increasing (e.g., an electrolyte leak rate), or both. The multiple threshold voltages may include a first threshold voltage indicative of a first electrolyte leak amount and/or a first electrolyte leak rate, a second threshold voltage indicative of a second electrolyte leak amount and/or a second electrolyte leak rate, a third threshold voltage indicative of a third electrolyte leak amount and/or a third electrolyte leak rate, a fourth threshold voltage indicative of a fourth electrolyte leak amount and/or a fourth electrolyte leak rate, and so on and so forth.

The method 250 also includes receiving (block 260), at the processor 72 and from the comparison device 118, an indication or signal 130 indicative of the presence of the electrolyte on the circuit board 70 (or the extent of the presence of the electrolyte on the circuit board 70). In some embodiments, the signal 130 may indicate the electrolyte leak amount and/or the electrolyte leak rate described above. For example, the signal 130 may include a characteristic (e.g., a voltage) indicative of the electrolyte leak amount and/or the electrolyte leak rate.

The method 250 also includes controlling (block 262) operation of the battery 40 via the processor 72 and based on the signal 130. Control actions executed by the processor 72 based on the signal 130 (e.g., in response to the presence of the electrolyte on the circuit board 70) may include, for example, disabling charging of the battery 40, executing a discharge profile to discharge the battery 40, and/or transmitting an alert indicative of an electrolyte leak to an external device. In some embodiments, the type of control action performed via the processor 72 at block 262 depends on the electrolyte leak amount and/or the electrolyte leak rate. For example, the processor 72 may disable charging of the battery 40 in response to the first electrolyte leak amount and/or the first electrolyte leak rate described above, execute a discharge profile to discharge the battery 40 in response to the second electrolyte leak amount and/or the second electrolyte leak rate described above, transmit an alert indicative of an electrolyte leak to an external device in response to the third electrolyte leak amount and/or the third electrolyte leak rate described above, and perform some other control action in response to the fourth electrolyte leak amount and/or the fourth electrolyte leak rate described above.

In general, embodiments of the present disclosure are directed toward circuitry and other features configured to detect a presence of an electrolyte on a circuit board (e.g., of a BMU for a battery). Presently disclosed systems and methods provide relatively small, cost effective, and reliable mechanisms for detecting the presence of the electrolyte on the circuit board and responding to the presence of the electrolyte on the circuit board with various control actions.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f).

However, for any claims containing elements designated in any other manner, it is intended that such elements are not to be interpreted

The invention claimed is:

1. A battery circuit board, comprising:
   a substrate;
   a first trace configured to receive a voltage and forming a first closed loop around a perimeter of the substrate;
   a second trace forming a second closed loop around the perimeter of the substrate; and
   an electrical assembly configured to determine a presence of a material on the battery circuit board in response to a short circuit between the first closed loop of the first trace and the second closed loop of the second trace.

2. The battery circuit board of claim 1, wherein the electrical assembly comprises:
   an extension from the second closed loop;
   a resistor having a first end coupled to the extension;
   a third trace coupled to a second end of the resistor; and
   a comparison device coupled to the third trace.

3. The battery circuit board of claim 2, wherein the electrical assembly comprises an additional resistor having an end coupled to a node at the third trace and having an additional end coupled to ground.

4. The battery circuit board of claim 2, wherein the comparison device is configured to:
   receive, from the third trace, a change in voltage; and
   determine or indicate the presence of the material on the battery circuit board or an extent of the presence of the material on the battery circuit board in response to the change in voltage causing a voltage difference between the first closed loop and the second closed loop to exceed a threshold voltage.

5. The battery circuit board of claim 4, wherein the comparison device is configured to:
   receive, from the third trace, the change in voltage; and
   determine or indicate an absence of the material on the battery circuit board in response to the change in voltage causing the voltage difference between the first closed loop and the second closed loop to be below the threshold voltage.

6. The battery circuit board of claim 5, wherein the voltage difference is less when the comparison device determines the absence of the material on the battery circuit board compared to when the comparison device determines the presence of the material on the battery circuit board.

7. The battery circuit board of claim 1, comprising a plurality of additional traces disposed on the battery circuit board and disposed within the perimeter of the substrate, wherein a distance between the first closed loop and the second closed loop is smaller than a smallest distance between any adjacent traces of the plurality of traces.

8. The battery circuit board of claim 1, comprising a third trace extending from the electrical assembly and toward a processor configured to:
   receive, from the third trace, a signal indicative of the presence or an absence of the material on the battery circuit board; and
   adjust operation of a battery corresponding to the battery circuit board based on the signal.

9. A battery, comprising:
   a substrate;
   a first closed loop trace extending around a perimeter of the substrate;
   a second closed loop trace extending around the perimeter of the substrate and positioned inward from the first closed loop trace; and
   an electrical assembly coupled to the second closed loop trace and configured to determine a presence or an absence of a material on the substrate in response to a change in a voltage difference between the first closed loop trace and the second closed loop trace.

10. The battery of claim 9, comprising a processor configured to:
    receive, from a component of the electrical assembly, a signal indicative of the presence or the absence of the material on the substrate; and
    adjust operation of the battery based on the signal.

11. The battery of claim 10, wherein the processor is configured to adjust the operation of the battery based on the signal by:
    transmitting an alert toward an external device;
    disabling charging of the battery; or
    executing a discharge profile to discharge the battery.

12. The battery of claim 9, wherein the electrical assembly is configured to determine the presence of the material on the substrate in response to a decrease in the voltage difference between the first closed loop trace and the second closed loop trace by receiving a voltage caused by a short circuit between the first closed loop trace and the second closed loop trace.

13. The battery of claim 12, wherein the electrical assembly comprises a comparison component configured to determine or indicate the presence of the material on the substrate or an extent of the presence of the material on the substrate in response to the voltage exceeding a threshold voltage.

14. The battery of claim 9, wherein the electrical assembly comprises:
    an extension from the second closed loop trace;
    a resistor having a first end coupled to the extension;
    a third trace coupled to a second end of the resistor; and
    a comparison component coupled to the third trace such that the extension, the resistor, the third trace, and the comparison component are in series.

15. The battery of claim 14, wherein the electrical assembly comprises an additional resistor having an end coupled to a node at the third trace and having an additional end coupled to ground.

16. The battery of claim 9, wherein the first closed loop trace is not coupled to the electrical assembly.

17. A battery, comprising:
    a substrate;
    a first closed loop trace disposed on the substrate;
    a second closed loop trace disposed on the substrate inwards from the first closed loop trace;
    an extension from the second closed loop trace;
    a resistor coupled to the extension;
    a third trace coupled to the resistor;
    an additional resistor coupled to a node at the third trace and to ground; and
    a comparison device coupled to the third trace such that the third trace is between the comparison device and the resistor, wherein the comparison device is configured to:
    receive a voltage caused by a short circuit between the first closed loop trace and the second closed loop trace; and
    determine or indicate a presence or an absence of a material on the substrate based on the voltage.

18. The battery of claim 17, comprising:
    an additional substrate disposed above the substrate;
    an additional first closed loop trace disposed on the additional substrate; and an additional second closed loop trace disposed on the additional substrate inwards from the additional first closed loop trace, wherein:
  the first closed loop trace disposed on the substrate is configured to receive a supply voltage; and
  the additional second closed loop trace disposed on the additional substrate is configured to receive the supply voltage or an additional supply voltage.

19. The battery of claim 17, comprising a processor configured to:
  receive, from the comparison device, a signal indicative of the presence or the absence of the material on the substrate; and
  adjust operation of the battery based on the signal.

20. The battery of claim 19, wherein the processor is configured to adjust the operation of the battery based on the signal by:
  transmitting an alert toward an external device;
  disabling charging of the battery; or
  executing a discharge profile to discharge the battery.

\* \* \* \* \*